(12) United States Patent
Liu et al.

(10) Patent No.: US 9,112,032 B1
(45) Date of Patent: Aug. 18, 2015

(54) METHODS OF FORMING REPLACEMENT GATE STRUCTURES ON SEMICONDUCTOR DEVICES

(71) Applicant: GLOBALFOUNDRIES Inc., Grand Cayman (KY)

(72) Inventors: Bingwu Liu, Ballston Spa, NY (US); Hui Zang, Guilderland, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/305,457

(22) Filed: Jun. 16, 2014

(51) Int. Cl.
| | | |
|---|---|---|
| H01L 21/336 | (2006.01) | |
| H01L 29/78 | (2006.01) | |
| H01L 29/66 | (2006.01) | |
| H01L 21/84 | (2006.01) | |
| H01L 29/423 | (2006.01) | |

(52) U.S. Cl.
CPC ............ *H01L 29/785* (2013.01); *H01L 21/845* (2013.01); *H01L 29/42392* (2013.01); *H01L 29/6681* (2013.01); *H01L 29/66545* (2013.01); *H01L 29/66795* (2013.01); *H01L 29/66818* (2013.01)

(58) Field of Classification Search
CPC ............ H01L 29/785; H01L 29/66795; H01L 29/66545; H01L 29/42392; H01L 29/66818; H01L 29/6681; H01L 21/845; H01L 27/1211
USPC ........... 438/283, 157, 156, 197; 257/E21.444
See application file for complete search history.

(56) References Cited

U.S. PATENT DOCUMENTS

| | | | |
|---|---|---|---|
| 7,074,662 B2 * | 7/2006 | Lee et al. | 438/199 |
| 7,091,551 B1 * | 8/2006 | Anderson et al. | 257/324 |
| 7,915,167 B2 * | 3/2011 | Radosavljevic et al. | 438/689 |
| 2004/0262676 A1 * | 12/2004 | Lee et al. | 257/328 |
| 2005/0051825 A1 * | 3/2005 | Fujiwara et al. | 257/308 |
| 2005/0145932 A1 * | 7/2005 | Park et al. | 257/328 |

* cited by examiner

*Primary Examiner* — Michael Trinh
(74) *Attorney, Agent, or Firm* — Amerson Law Firm, PLLC

(57) ABSTRACT

One illustrative method disclosed herein includes, among other things, forming a fin protection layer around a fin, forming a sacrificial gate electrode above a section of the fin protection layer, forming at least one sidewall spacer adjacent the sacrificial gate electrode, removing the sacrificial gate electrode to define a gate cavity that exposes a portion of the fin protection layer, oxidizing at least the exposed portion of the fin protection layer to thereby form an oxidized portion of the fin protection layer, and removing the oxidized portion of the fin protection layer so as to thereby expose a surface of the fin within the gate cavity.

15 Claims, 15 Drawing Sheets

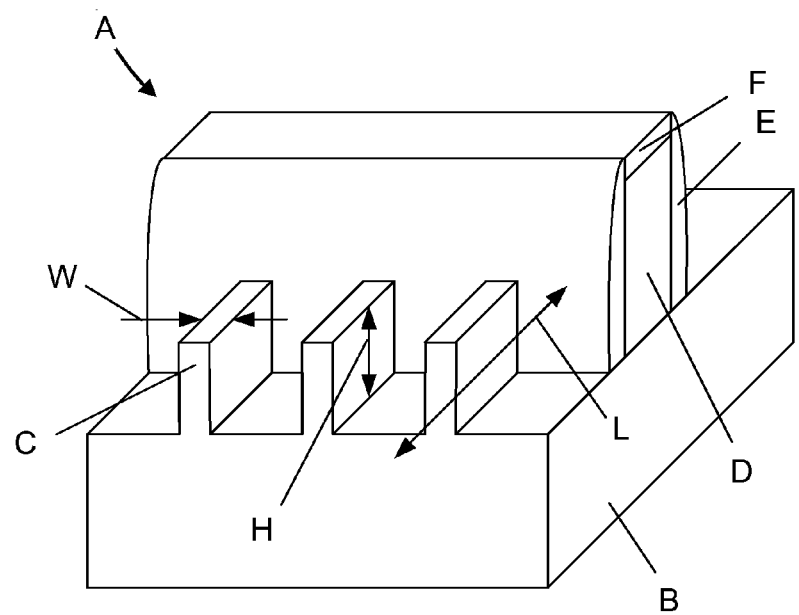
Figure 1A (Prior Art)
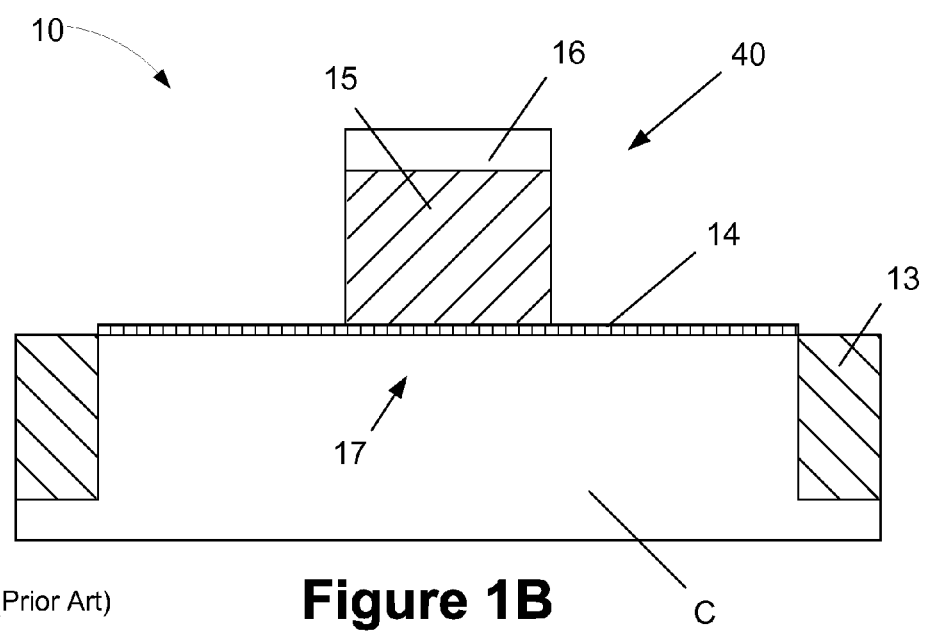
(Prior Art) Figure 1B

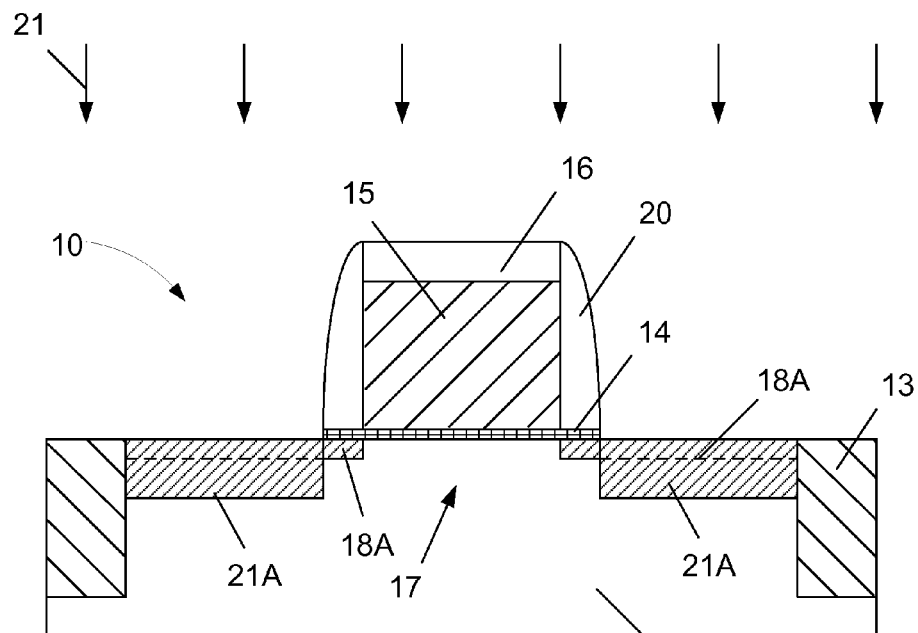
(Prior Art) Figure 1E
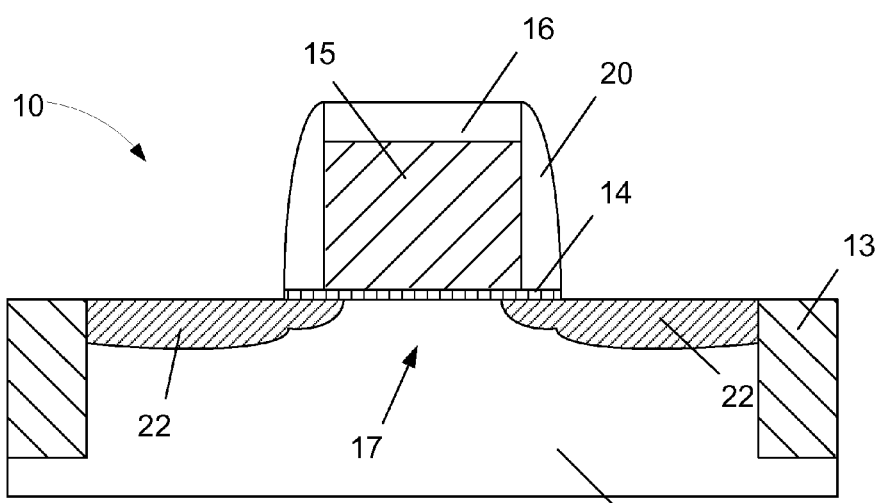
(Prior Art) Figure 1F

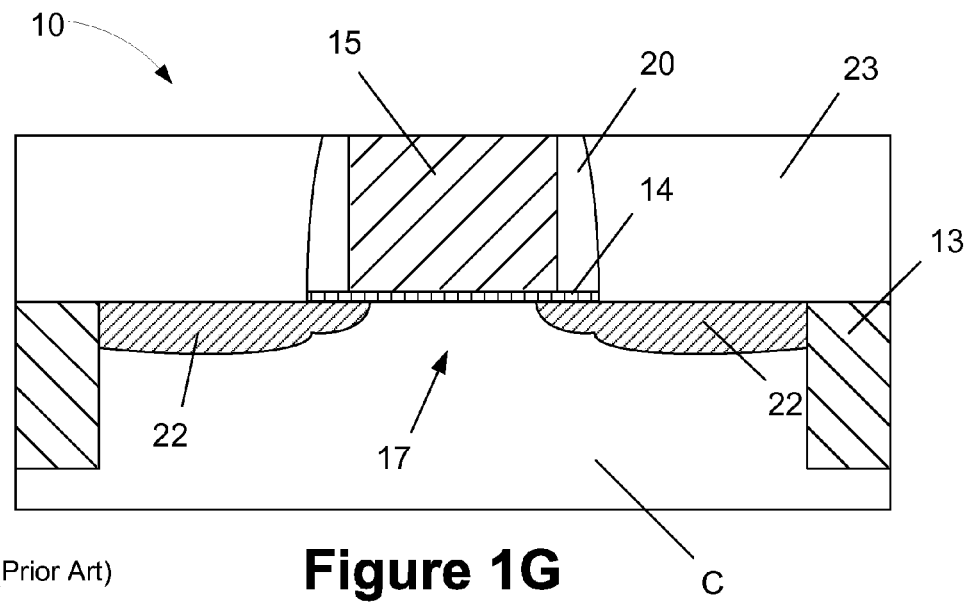
(Prior Art) Figure 1G
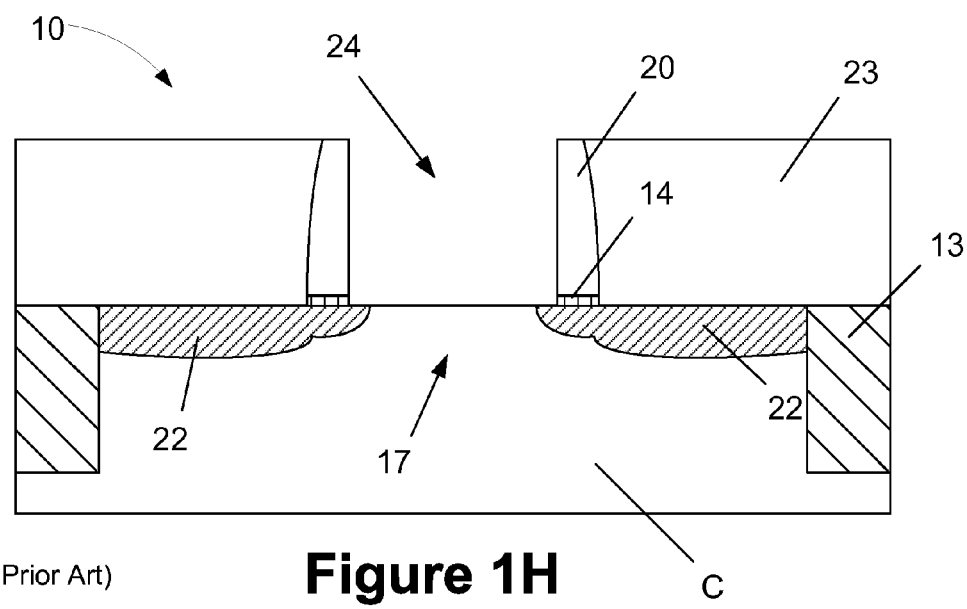
(Prior Art) Figure 1H

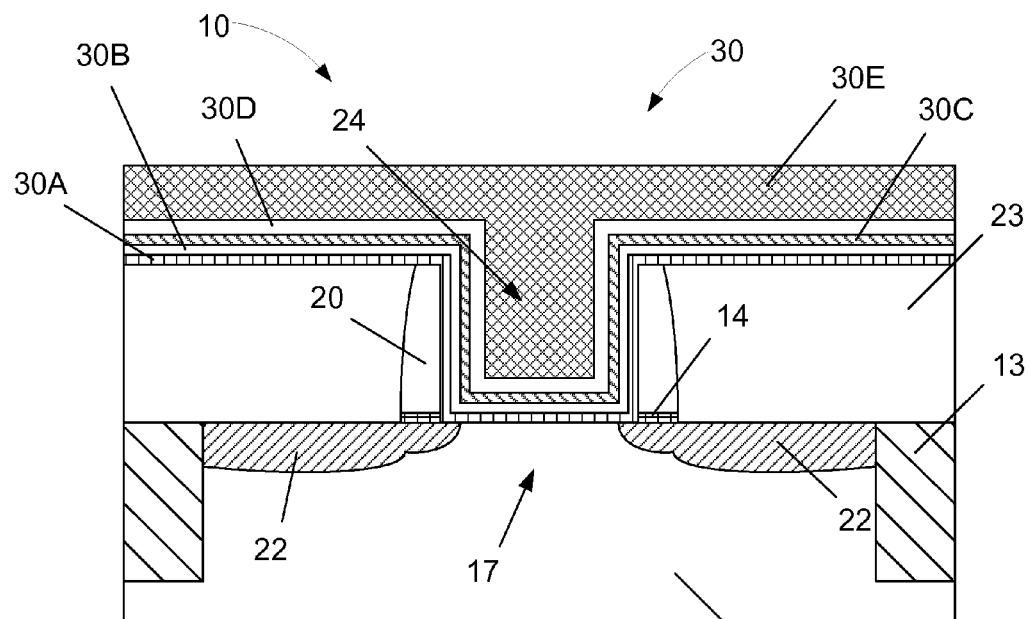
(Prior Art) Figure 1I
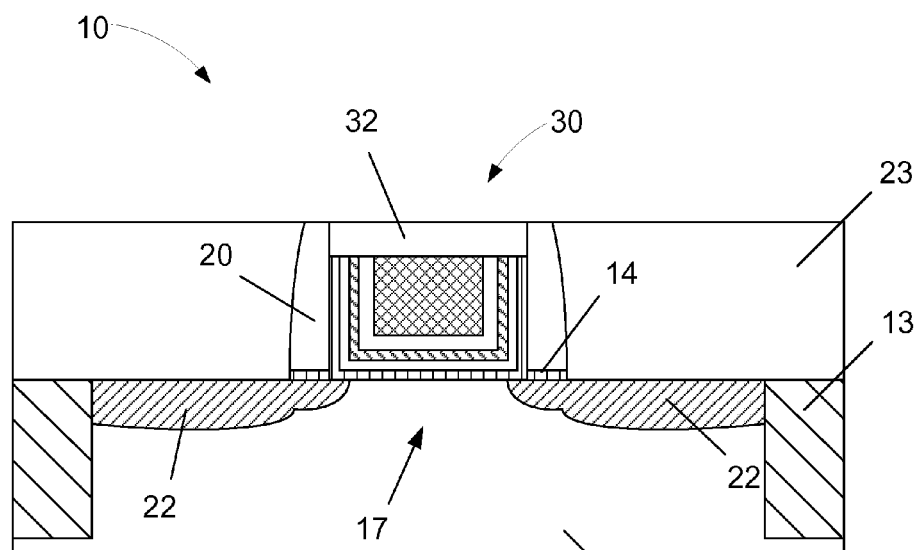
(Prior Art) Figure 1J

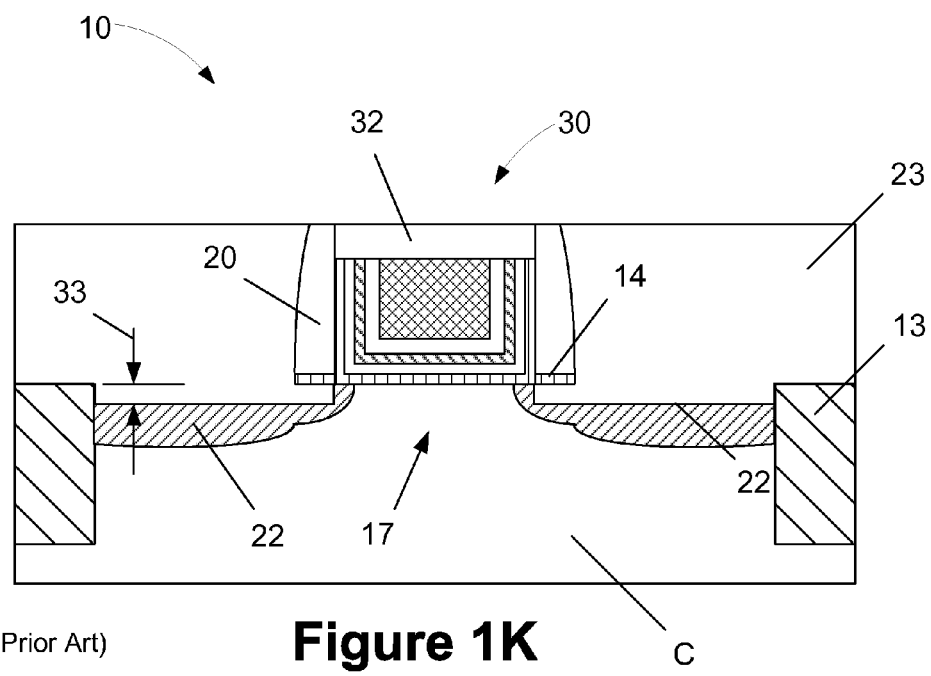
(Prior Art) Figure 1K
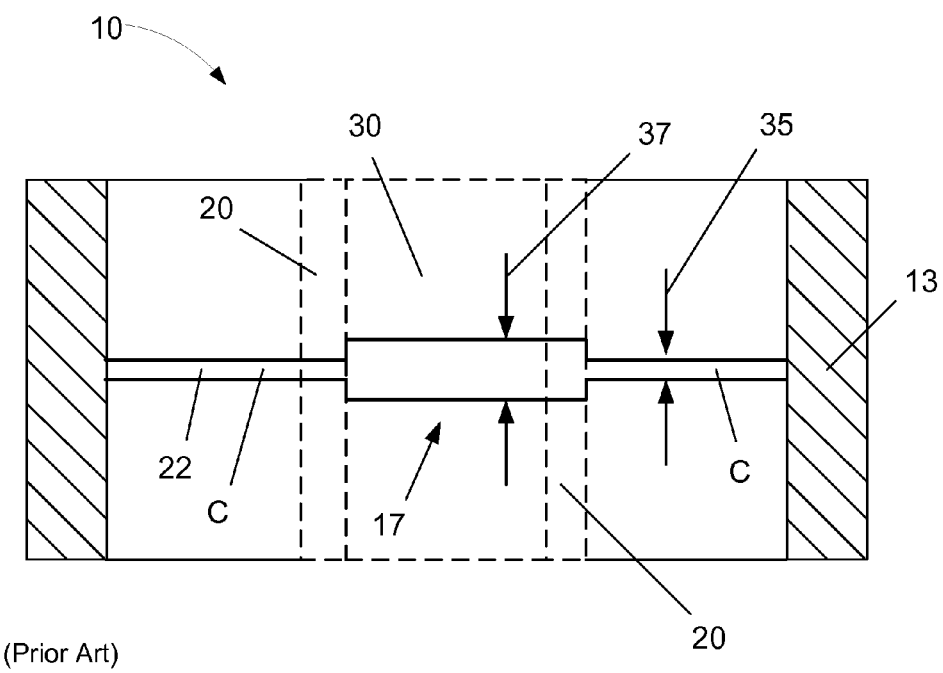
(Prior Art) Figure 1L

METHODS OF FORMING REPLACEMENT GATE STRUCTURES ON SEMICONDUCTOR DEVICES

BACKGROUND OF THE INVENTION

1. Field of the Invention

The present disclosure generally relates to the fabrication of integrated circuits, and, more particularly, to various methods of forming a replacement gate structure on a semiconductor device.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Typically, a high performance integrated circuit product, such as a high performance microprocessor, will contain billions of individual field effect transistors (FETs). The transistors are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region of the transistor. The transistor devices come in a variety of forms, e.g., so-called planar transistor devices, 3D or FinFET devices, etc.

FIG. 1A is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap layer F. The gate structure D is typically comprised of a layer of gate insulating material (not separately shown), e.g., a layer of high-k insulating material (k-value of 10 or greater) or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D are the channel regions of the FinFET device A. In a conventional process flow, the portions of the fins C that are positioned outside of the spacers E, i.e., in the source/drain regions of the device A, may be increased in size or even merged together (a situation not shown in FIG. 1A) by performing one or more epitaxial growth processes. In the FinFET device, the gate structure D may enclose both the sides and the upper surface of all or a portion of the fins C to form a tri-gate structure, i.e., a channel having a three-dimensional structure instead of a planar structure. In some cases, an insulating cap layer (not shown), e.g., silicon nitride, is positioned at the top of the fins C and the FinFET device only has a dual-gate structure (sidewalls only). Unlike a planar FET, in a FinFET device, a channel is formed perpendicular to a surface of the semiconducting substrate so as to reduce the physical size of the semiconductor device. The gate structures D for such FinFET devices may be manufactured using so-called "gate-first" or "replacement gate" (gate-last) manufacturing techniques.

For many early device technology generations, the gate structures of most transistor elements (planar and FinFET devices) were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

As mentioned above, the replacement gate process may be used when forming planar devices or 3D devices. FIGS. 1B-1J are cross-sectional views taken through the long axis of a fin C (i.e., in the current transport direction) that simplistically and idealistically depict one illustrative prior art method for forming an HK/MG replacement gate structure using a replacement gate technique on a FinFET transistor device.

FIG. 1B depicts the device 10 after several operations were performed. More specifically, at the point of fabrication depicted in FIG. 1B, the basic fin structures C and isolation regions 13 were formed in the substrate. Also depicted is a sacrificial gate structure 40 comprised of a sacrificial gate insulation layer 14 and a dummy or sacrificial gate electrode 15. A gate cap layer 16 is positioned above the sacrificial gate electrode 15. The structure depicted in FIG. 1B may be formed by thermally growing the sacrificial silicon dioxide gate insulating layer 14 and then depositing a gate electrode material (e.g., polysilicon) layer and a gate cap material layer (e.g., silicon nitride) above the substrate. Thereafter, the gate electrode material layer and the gate cap layer are patterned by performing known photolithography and etching processes using the sacrificial gate insulation layer 14 as an etch stop layer. Although the exposed portions of the sacrificial gate insulation layer 14 are depicted as having survived the gate patterning process, in practice, at least some of the thickness of the sacrificial gate insulation layer 14 will be consumed in the process of patterning the sacrificial gate structure 40.

In forming a transistor device, various ion implantation processes are performed to introduce various dopant materials into the fin C to form source/drain regions for the device. Of course, the type of dopants implanted, either N-type or P-type dopants, depends upon the type of transistor being made, i.e., an NMOS transistor or a PMOS transistor, respectively. A typical implantation sequence would involve formation of so-called halo implant regions, source/drain extension implant regions and deep source/drain implant regions. For an NMOS device, the halo implant region would be formed with a P-type dopant, while the extension and deep source/drain implant regions would be formed using an N-type dopant material. Accordingly, FIG. 1C depicts the device 10 after an ion implantation process 18 was performed to form so-called extension implant regions 18A in the fin C. A halo implantation process would also be performed to form halo implant regions (not shown) in the fin C at this point in the process flow. Although the arrows representing the implantation process 18 are vertically oriented, the extension implantation process and the halo implant process may be performed at an angle relative to the vertical to insure placement to the implanted materials at the desired location. The masking layer(s) that would be used during the implantation sequence discussed herein are not depicted in the drawings.

FIG. 1D depicts the device 10 after sidewall spacers 20 were formed proximate the sacrificial gate structure 40.

FIG. 1E depicts the device 10 after a second ion implantation process 21 was performed on the transistor 10 to form so-called deep source/drain implant regions 21A in the fins C. The ion implantation process performed to form the deep source/drain implant regions 21A is typically performed using a higher dopant dose and it is performed at a higher implant energy than the ion implantation process that was performed to form the extension implant regions 18A.

Thereafter, as shown in FIG. 1F, a heating or anneal process is performed to form the final source/drain regions 22 for the transistor 10. This heating process repairs the damage to the lattice structure of the fin material as a result of the implantation processes and it activates the implanted dopant materials, i.e., the implanted dopant materials are incorporated into the silicon lattice.

FIG. 1G depicts the device 10 after several process operations were performed. First, a layer of insulating material 23 was deposited above the device 10. Thereafter, a chemical mechanical planarization process was performed to remove the gate cap layer 16 and expose the sacrificial gate electrode 15.

Next, as shown in FIG. 1H, one or more etching processes were performed to remove the sacrificial gate electrode 15 and the sacrificial gate insulation layer 14 to thereby define a replacement gate cavity 24 where a replacement gate structure will subsequently be formed. Typically, the sacrificial gate insulation layer 14 is removed as part of the replacement gate technique, as depicted herein. However, the sacrificial gate insulation layer 14 may not be removed in all applications. Even in cases where the sacrificial gate insulation layer 14 is intentionally removed, there will typically be a very thin native oxide layer (not shown) that forms on the fin within the gate cavity 24.

Next, as shown in FIG. 1I, various layers of material that will constitute a replacement gate structure 30 are formed in the gate cavity 24. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten.

FIG. 1J depicts the device 10 after several process operations were performed. First, one or more CMP processes were performed to remove excess portions of the gate insulation layer 30A, the first metal layer 30B, the second metal layer 30C, the third metal layer 30D and the bulk metal layer 30E positioned outside of the gate cavity 24 to thereby define the replacement gate structure 30 for an illustrative NMOS device. Then, one or more recess etching processes were performed to remove upper portions of the various materials within the cavity 24 so as to form a recess within the gate cavity 24. Then, a gate cap layer 32 was formed in the recess above the recessed gate materials. The gate cap layer 32 is typically comprised of silicon nitride and it may be formed by depositing a layer of gate cap material so as to over-fill the recess formed in the gate cavity and, thereafter, performing a CMP process to remove excess portions of the gate cap material layer positioned above the surface of the layer of insulating material 23.

As mentioned above, FIGS. 1B-1J depict an idealized situation where a replacement gate structure 30 is formed on a FinFET device. In practice, the portions of the fin C after formation of the sacrificial gate structure 40, i.e., before the formation of the spacers 20, is subjected to several process operations, such as ion implantation processes, cleaning processes, processes performed to remove masking layers, etc. As a result of the process operations, the physical size of the fin C beyond the channel region 17 of the device 10 is decreased in both height and width as compared to the portion of the fin C in the channel region of the device 10, i.e., the portions covered by the sacrificial gate structure 40. For example, by being exposed to multiple ion implantation processes, the fin material tends to amorphize to at least some degree, thereby making it more subject to removal when the amophized portions are exposed to later cleaning process operations.

FIG. 1K is a cross-sectional view taken through a fin C, while FIG. 1L is a plan view of a single fin C with the location of the replacement gate structure 30 and the spacers 20 indicated by dashed lines. As shown in FIG. 1K, the portions of the fin C that were not covered by the original sacrificial gate structure 40 are shorter than the portion of the fin C in the channel region, as indicated by the dimension 33. The dimension 33 may be about 3-5 nm in some applications. Similarly, as shown in FIG. 1L, the portions of the fin C that were not covered by the original sacrificial gate structure 40 have a width 35 that is less than the width 37 of the portion of the fin C in the channel region 17. In some cases, the loss of material of the fin structure in the areas outside of the channel region 17 may be as much as about 40 percent of the starting width of the fin C. This situation leads to an undesirable and significant increase in resistance of the device 10, which may result in reduced operational performance and/or power consumption by the device 10.

The present disclosure is directed to various methods of forming a replacement gate structure on a semiconductor device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming replacement gate structures on semiconductor devices. One illustrative method disclosed herein includes, among other things, forming a fin in a semiconductor substrate, forming a fin protection layer around the fin, forming a sacrificial gate electrode above a section of the fin protection layer, forming at least one sidewall spacer adjacent the sacrificial gate electrode, removing the sacrificial gate electrode to define a gate cavity that exposes a portion of the fin protection layer, oxidizing at least the exposed portion of the fin protection layer to thereby form an oxidized portion of the fin protection layer, and removing the oxidized portion of the fin protection layer so as to thereby expose a surface of the fin within the gate cavity.

Another illustrative method disclosed herein includes, among other things, forming a fin in a semiconductor substrate, forming a fin protection layer around the fin, forming a sacrificial gate electrode above a section of the fin protection layer, forming a first sidewall spacer adjacent the sacrificial gate electrode, and forming a second sidewall spacer adjacent the first sidewall spacer. In this embodiment, the method also includes removing the sacrificial gate electrode to define a gate cavity defined by the first sidewall spacer that exposes a portion of the fin protection layer, oxidizing at least the exposed portion of the fin protection layer to thereby form an oxidized portion of the fin protection layer, removing the first sidewall spacer and the oxidized portion of the fin protection layer so as to thereby expose a surface of the fin within the gate cavity, performing an oxidation process to form an oxide layer on the exposed surface of the fin, removing the oxide layer, after removing the oxide layer, forming a replacement gate structure above the fin within the gate cavity, and forming a gate cap layer above the replacement gate structure.

Another illustrative method disclosed herein includes, among other things, forming a fin in a semiconductor substrate, forming a fin protection layer around the fin, forming a sacrificial gate electrode above a section of the fin protection layer, forming a first sidewall spacer adjacent the sacrificial gate electrode, forming a second sidewall spacer adjacent the first sidewall spacer, and removing the sacrificial gate electrode to define a gate cavity defined by the first sidewall spacer that exposes a portion of the fin protection layer. In this embodiment, the method also includes oxidizing at least the exposed portion of the fin protection layer to thereby form an oxidized portion of the fin protection layer, removing the first sidewall spacer and the oxidized portion of the fin protection layer so as to thereby expose a surface of the fin within the gate cavity, forming a gate structure above the fin within the gate cavity, and forming a gate cap layer above the gate structure.

Yet another illustrative method disclosed herein includes, among other things, forming a fin in a semiconductor substrate, forming a fin protection layer around the fin, forming a sacrificial gate electrode above a section of the fin protection layer, forming at least one sidewall spacer adjacent the sacrificial gate electrode, removing the sacrificial gate electrode to define a gate cavity that exposes a portion of the fin protection layer, oxidizing at least the exposed portion of the fin protection layer to thereby form an oxidized portion of the fin protection layer, forming a conductive gate structure in the gate cavity above the oxidized portions of the fin protection layer, and forming a gate cap layer above the gate cavity.

BRIEF DESCRIPTION OF THE DRAWINGS

The disclosure may be understood by reference to the following description taken in conjunction with the accompanying drawings, in which like reference numerals identify like elements, and in which:

FIG. 1A is a perspective view of a simplistically depicted prior art FinFET device;

FIGS. 1B-1K are cross-sectional views taken through the long axis of a fin of a FinFET device and FIG. 1L is a plan view that depict one illustrative prior art method for forming a replacement gate structure on such a device.

Figure 1C:
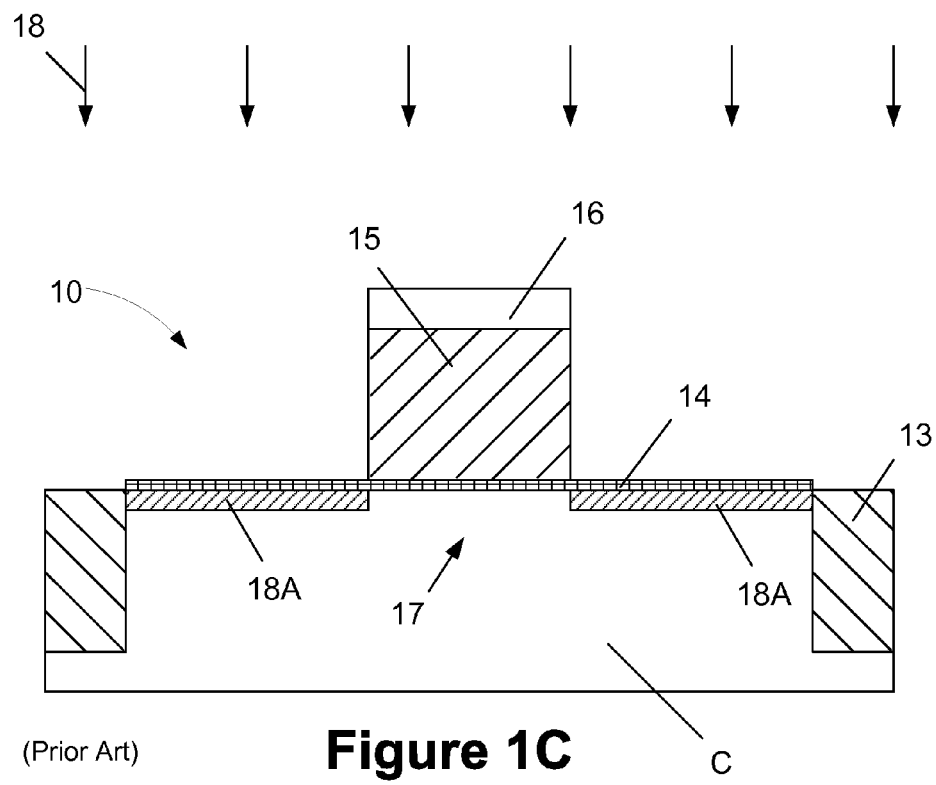
Figure 1D:
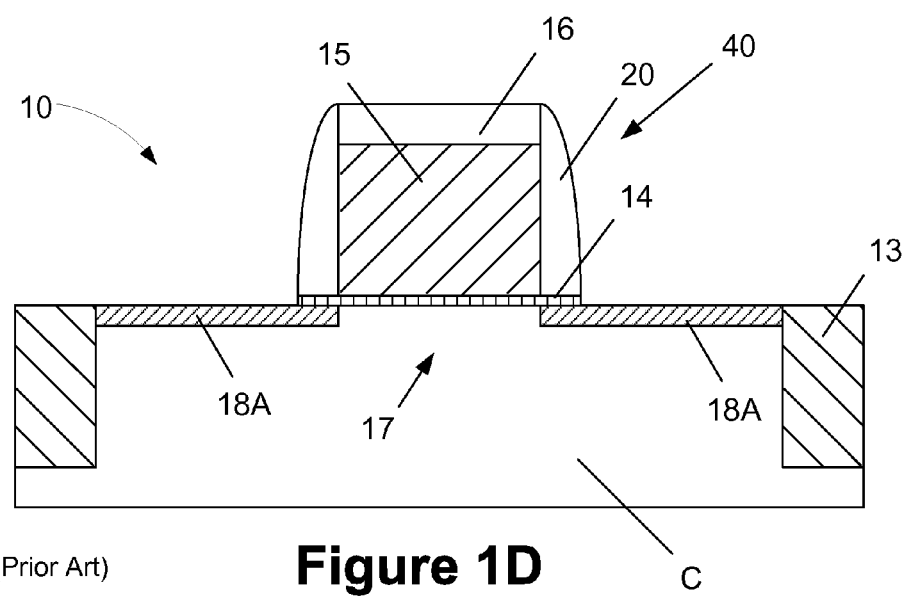

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming a replacement gate structure on a semiconductor device. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Additionally, various doped regions, e.g., halo implant regions, well regions and the like, are not depicted in the attached drawings. Of course, the inventions disclosed herein should not be considered to be limited to the illustrative examples depicted and described herein. The various components and structures of the device 100 disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 2A:
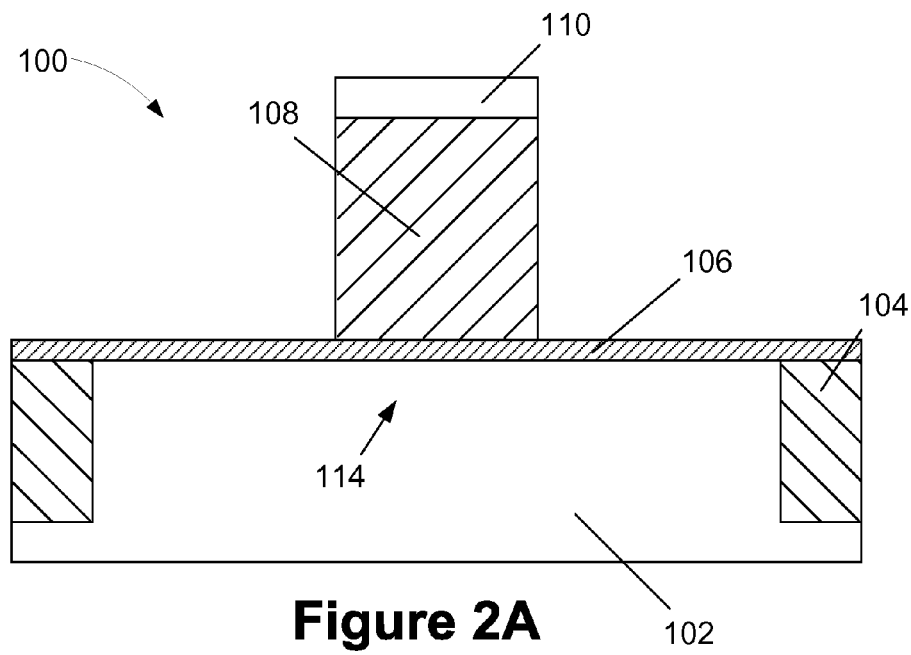
FIGS. 2A-2P depict various illustrative and novel methods disclosed herein of forming replacement gate structures on a semiconductor device.
Figure 2B:
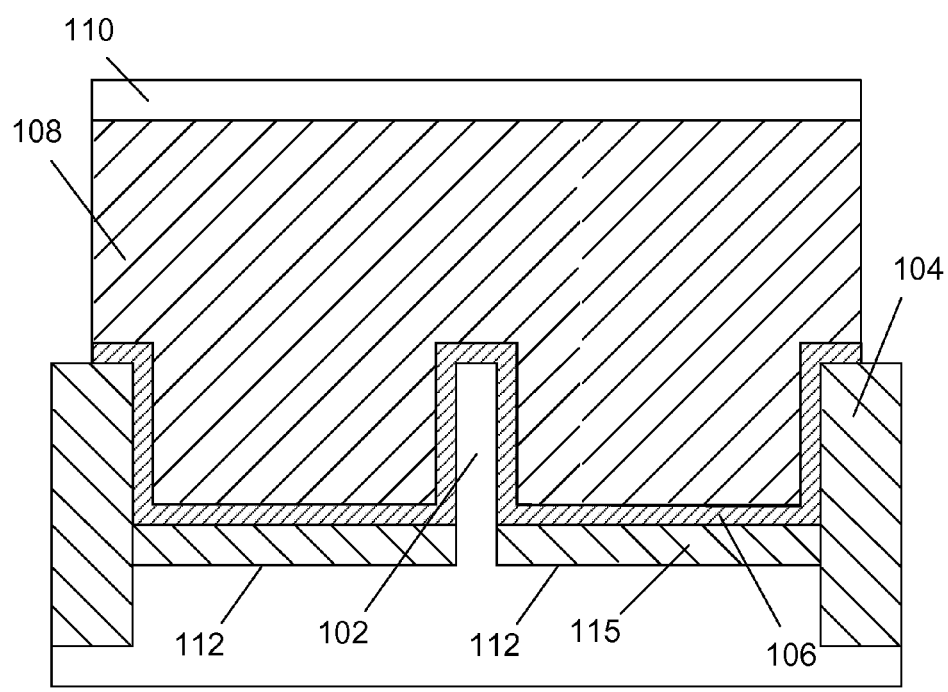
Figure 2C:
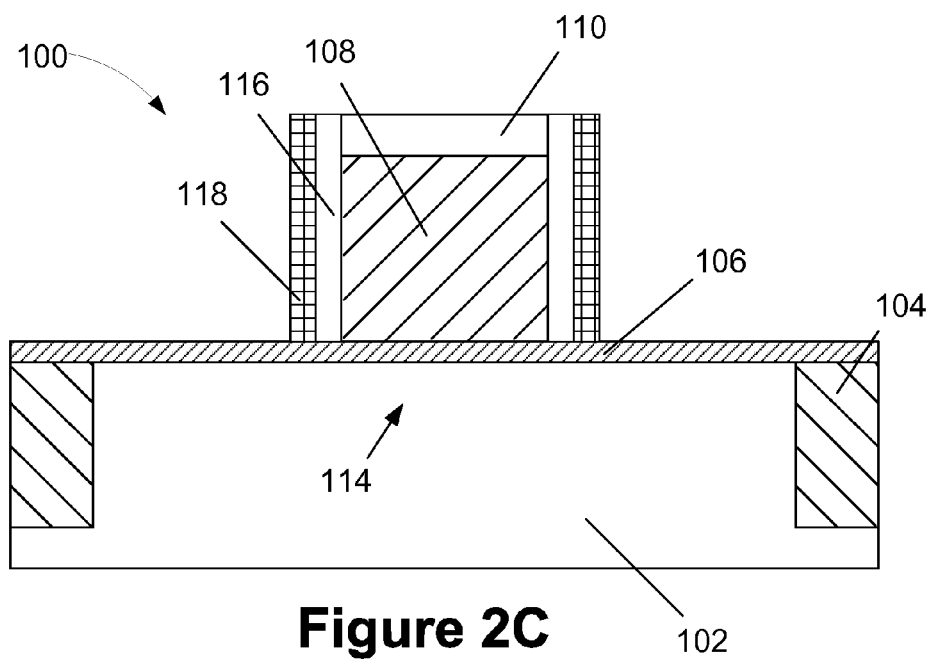
Figure 2D:
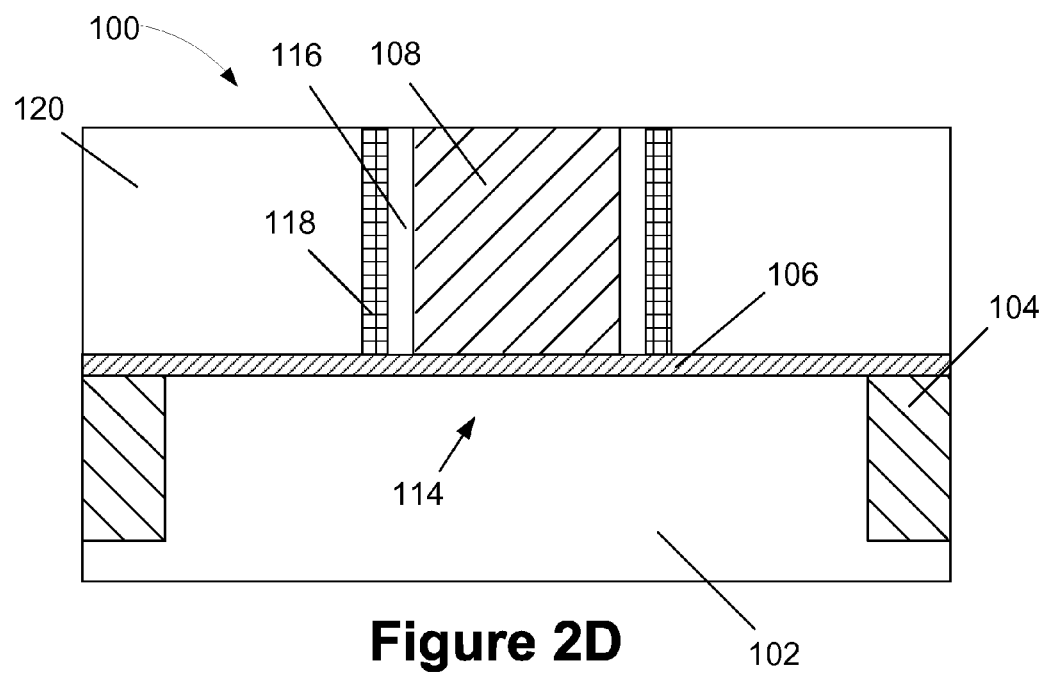
Figure 2E:
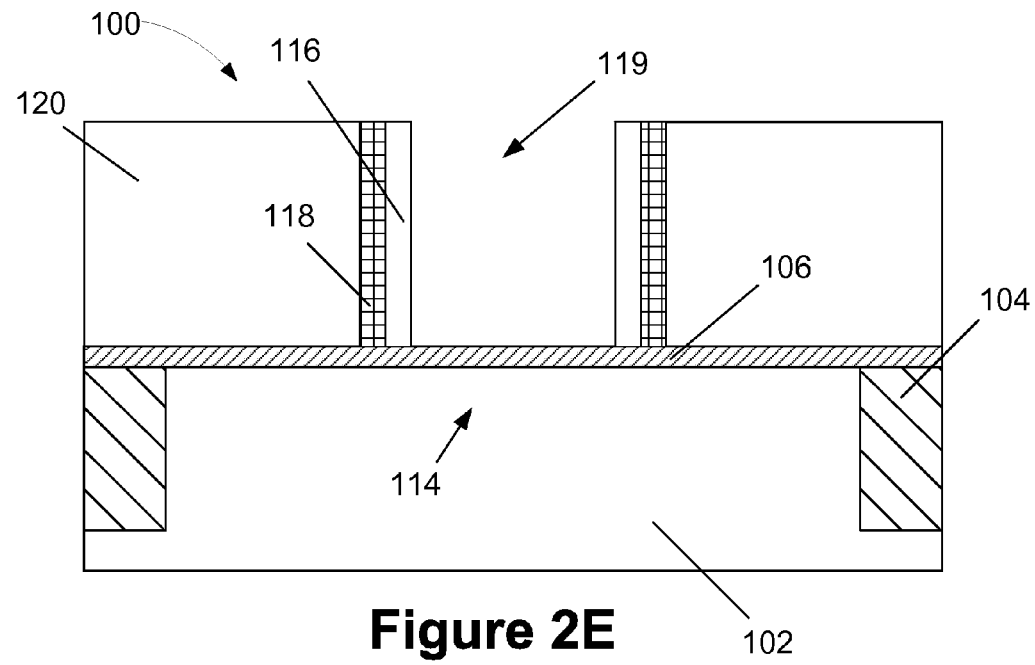
Figure 2F:
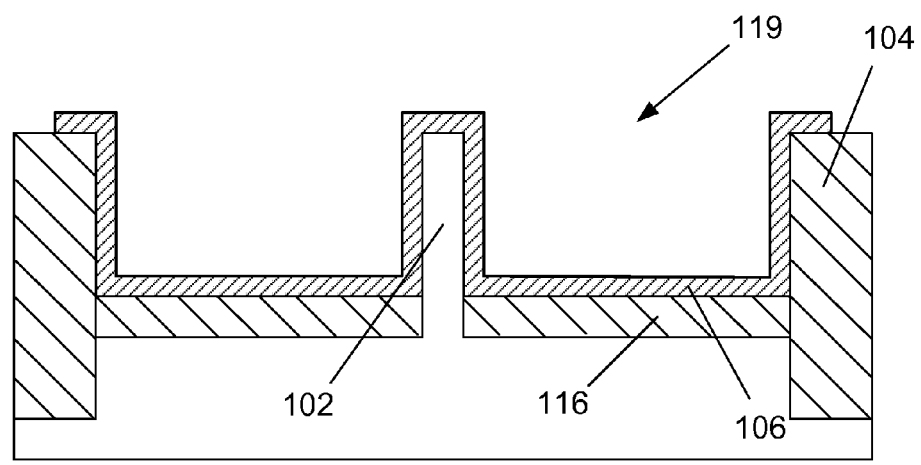
Figure 2G:
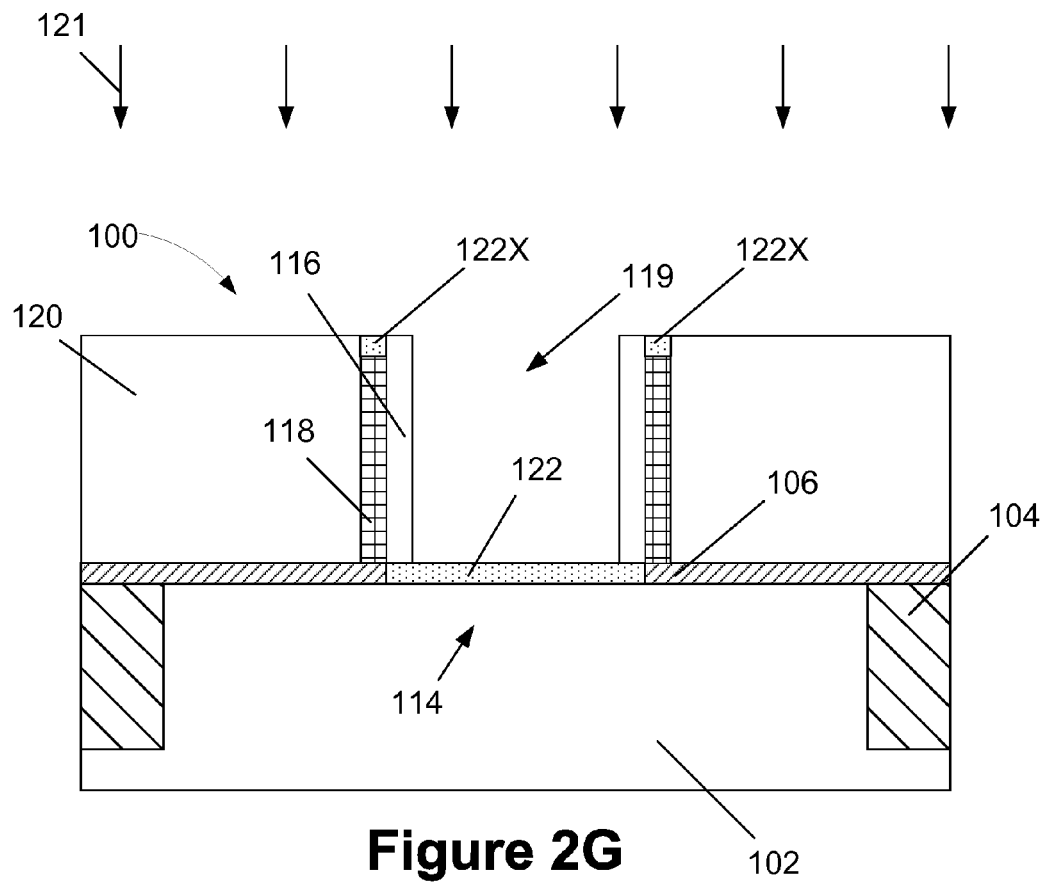
Figure 2H:
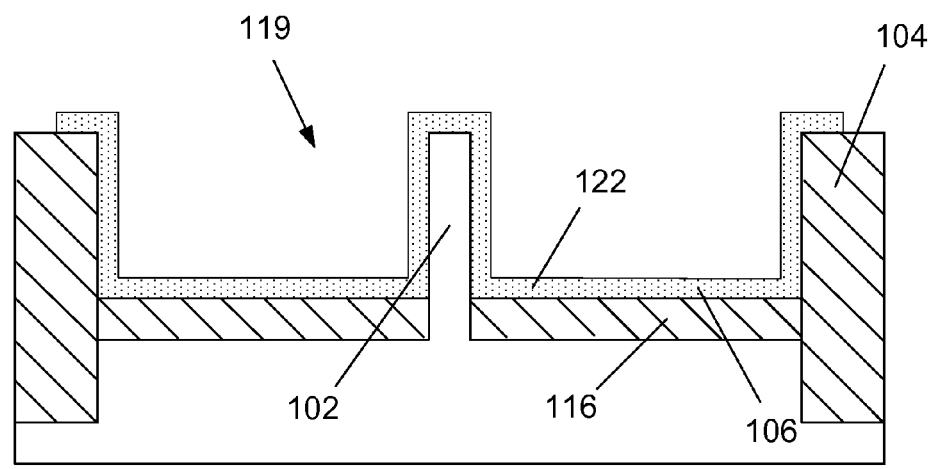
Figure 2I:
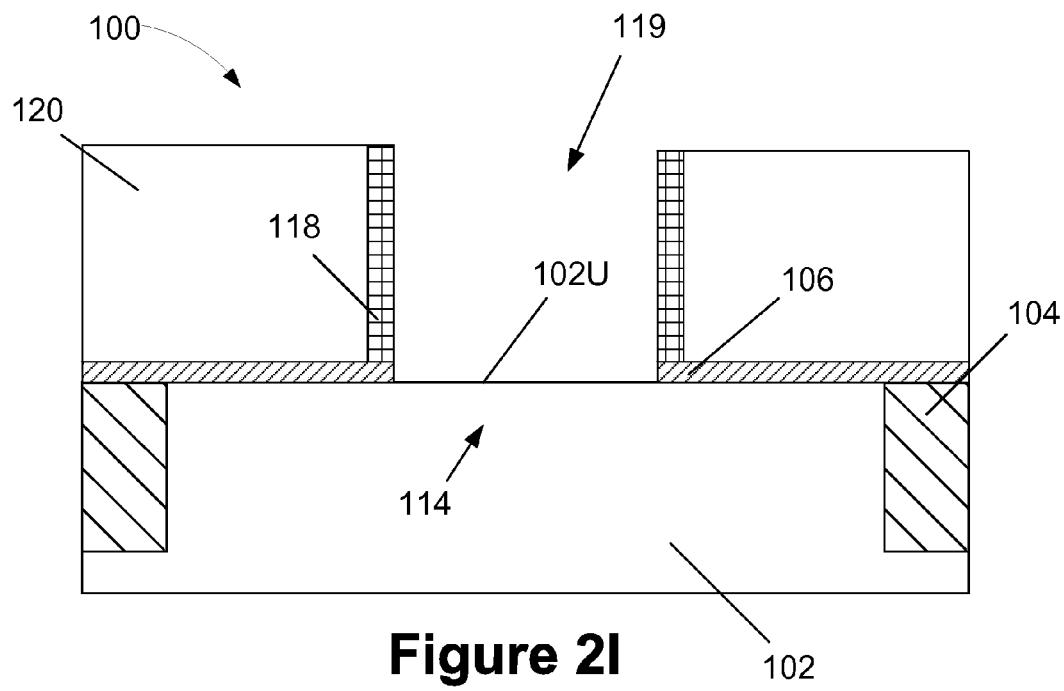
Figure 2J:
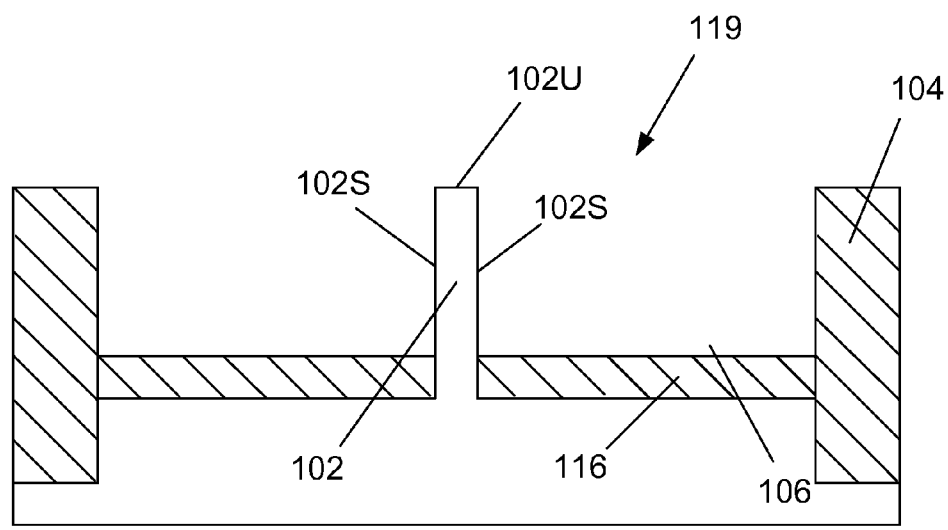
Figure 2K:
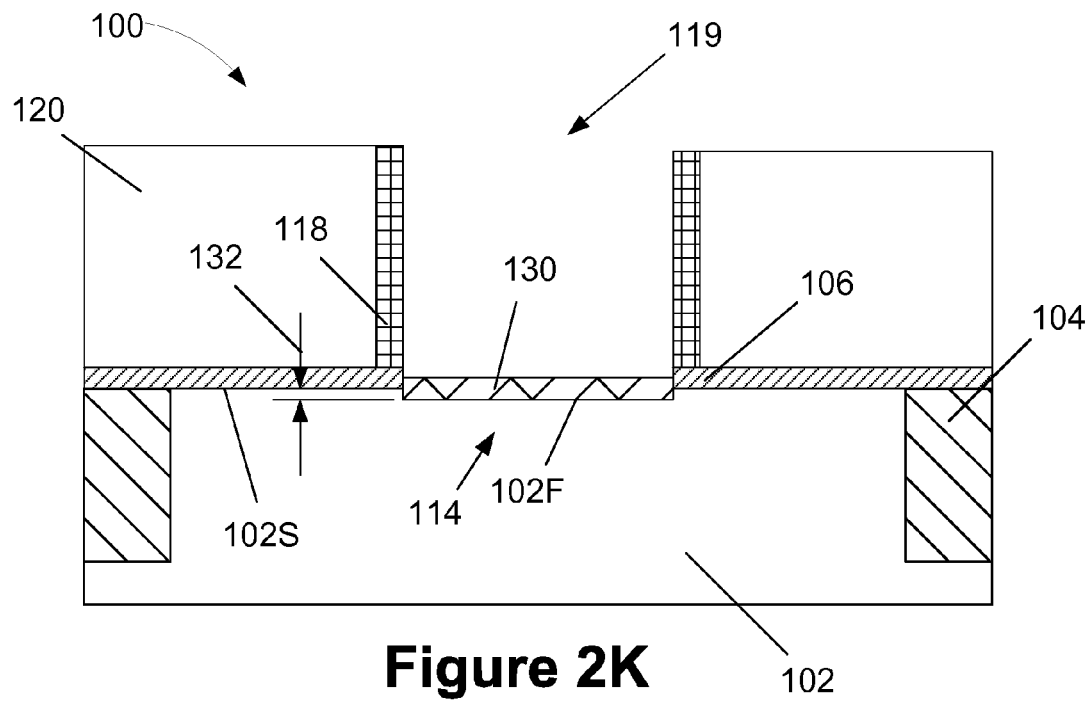
Figure 2L:
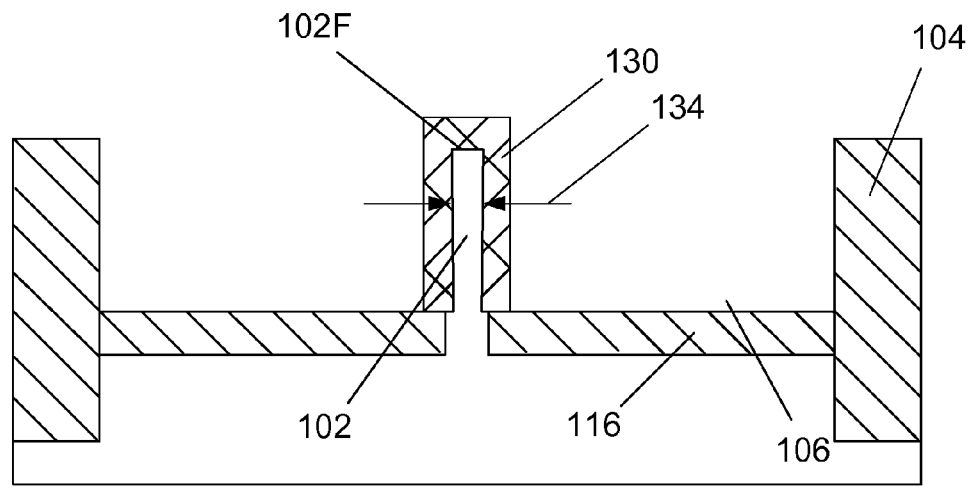
Figure 2M:
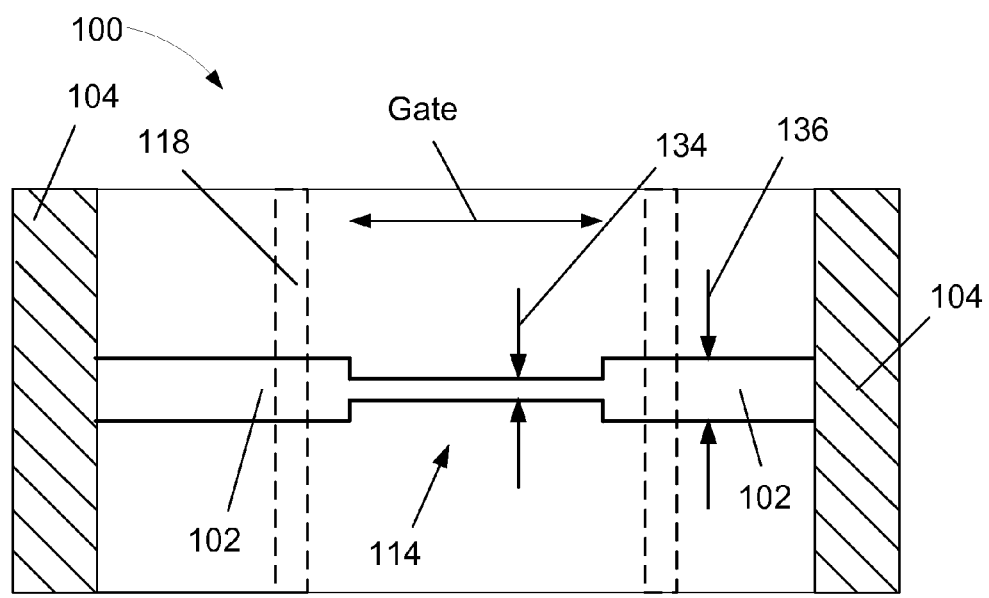
Figure 2N:
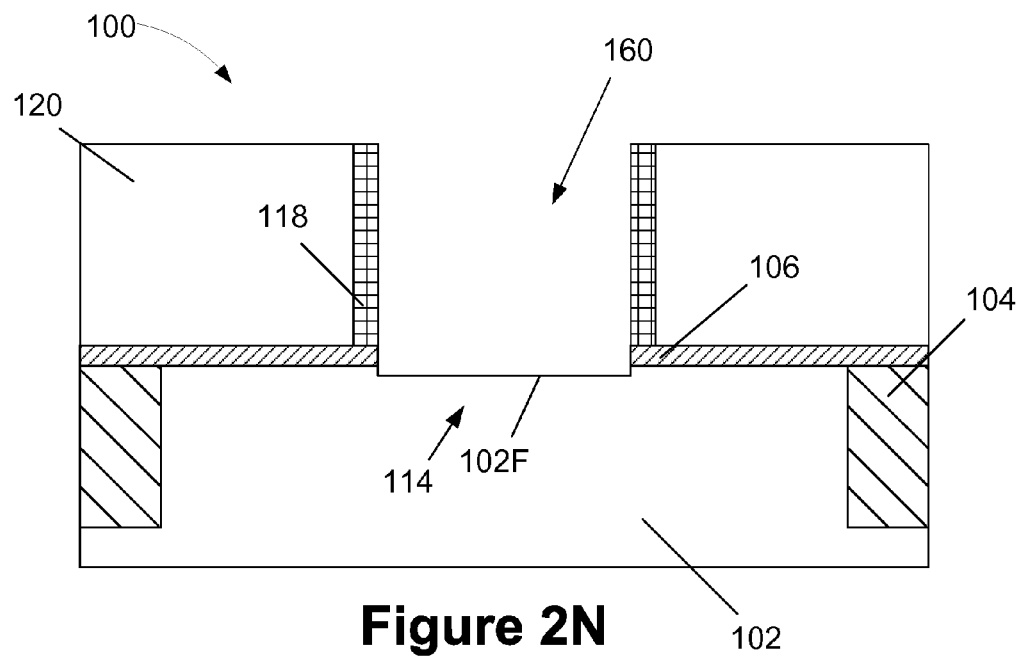
Figure 2O:
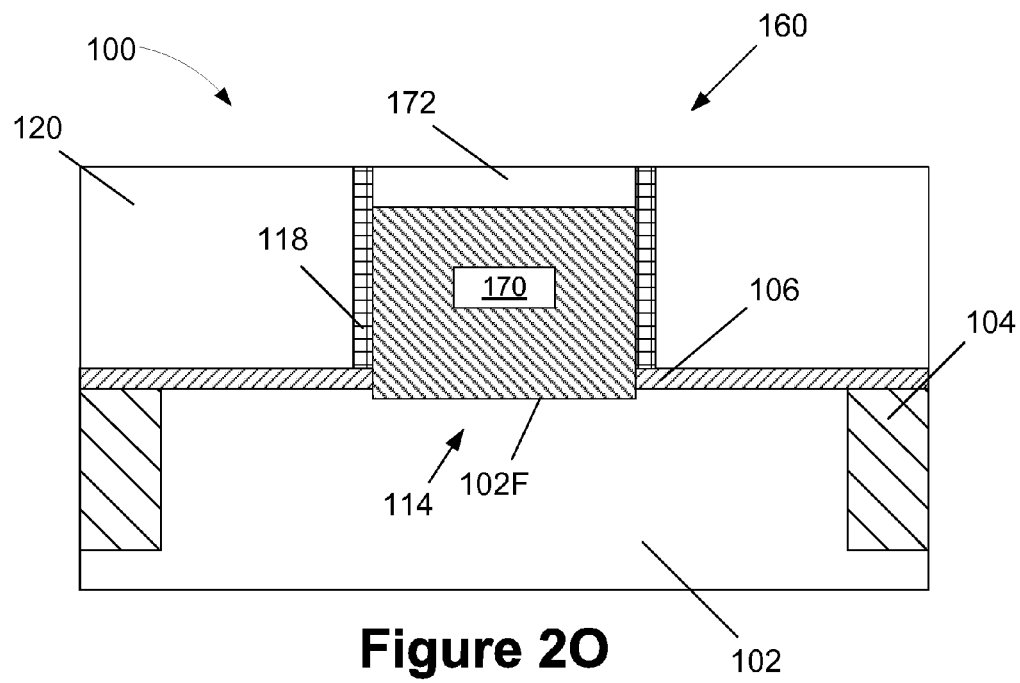
Figure 2P:
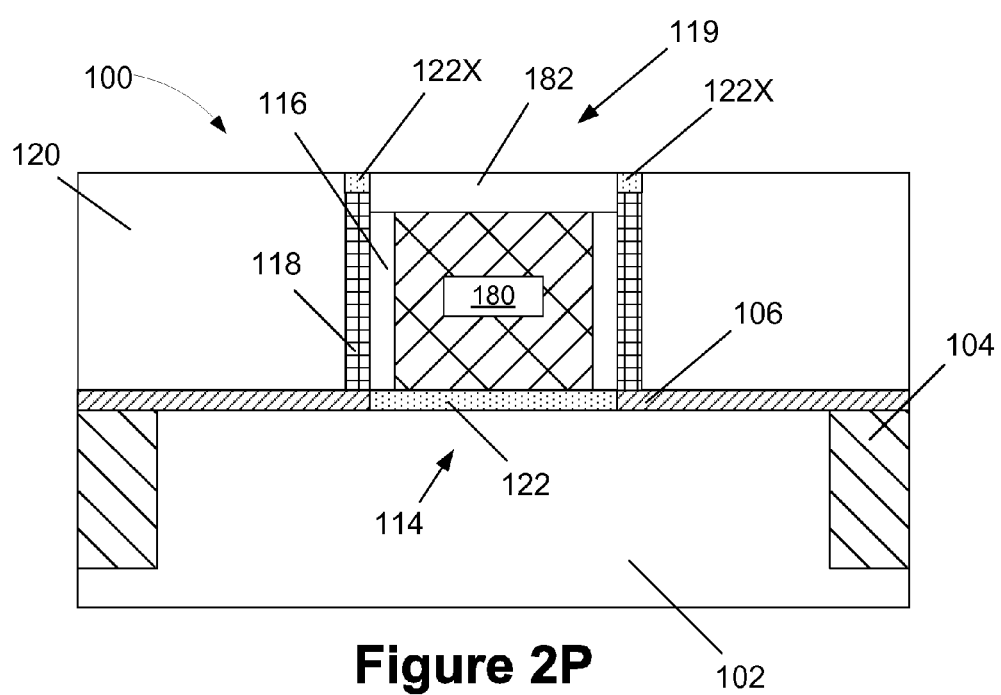

FIGS. 2A-2P are cross-sectional views of an illustrative FinFET device 100 that depict various illustrative methods disclosed herein of forming replacement gate structures on such a device. Some of the cross-sectional views are taken through the long axis of the fin, i.e., in the gate length or current transport direction when the device is operational (hereinafter the "gate length view"). Other cross-sectional views are taken through the long axis of the gate structure, i.e., in the gate width direction of the device (hereinafter the "gate width view").

FIGS. 2A (gate length view) and 2B (gate width view) depict the device 100 after several operations were performed. More specifically, at the point of fabrication depicted in these drawings, the basic fin structures 102 and isolation regions 104 were formed in the substrate using known fabrication methods. Also depicted in FIG. 2B is additional insulation material 115 that was formed in the bottom of the trenches 112 that were etched into the substrate to define the fin 102. The insulation material 115 was formed by overfilling the trenches 112 and then performing a recess etching process on the insulating material 115 until the desired height of the fin 102 was exposed.

With continuing reference to FIGS. 2A-2B, also depicted are a sacrificial fin protection layer 106, a first dummy or sacrificial gate electrode 108 and a gate cap layer 110 positioned above the first sacrificial gate electrode 108. As will be appreciated by those skilled in the art, when the device 100 is completed, the channel region 114 for the device will be located in the area under the sacrificial gate electrode 108. The structure depicted in FIGS. 2A-2B may be formed by depositing the sacrificial fin protection layer 106, a material layer for the sacrificial gate electrode 108 and a material layer for the gate cap layer 110. Thereafter, the gate electrode material layer and the gate cap layer are patterned by performing known photolithography and etching processes using the sacrificial fin protection layer 106 as an etch stop layer. The sacrificial gate electrode 108 may be comprised of a material such as polysilicon or amorphous silicon, and its thickness may vary depending upon the application. The gate cap layer 110 may be comprised of a variety of materials as well, e.g., silicon nitride.

At this point in the process flow, various ion implantation processes are performed through a patterned implant mask (not shown) to form various regions in the fin 102, e.g., halo implant regions, source/drain extension implant regions, etc. So as not to obscure the presently disclosed inventions, such implant regions are not depicted in the drawings. Importantly, unlike the prior art process flow discussed in the background section of this application, the sacrificial fin protection layer 106 is made of a material that is specifically designed and selected so as to protect the integrity of the portions of the fin 102 that are not covered by the first sacrificial gate electrode 108 during these various ion implantation processes. The sacrificial fin protection layer 106 may be comprised of a variety of different oxidizable materials, e.g., silicon nitride, a low-k material (k value less than 3.3.), etc., and its thickness may vary depending upon the particular application, e.g., 1-6 nm. Of course, the type of dopants implanted, either N-type or P-type dopants, depends upon the type of transistor being made, i.e., an NMOS transistor or a PMOS transistor, respectively. At this point in the process flow, a typical implantation sequence would involve formation of so-called halo implant regions and source/drain extension implant regions. As discussed in the background section of this application, for an NMOS device, the halo implant regions would be formed with a P-type dopant, while the extension implant regions would be formed using an N-type dopant material.

After the above-described halo implant regions and source/drain extension implant regions are formed, sidewall spacers are formed on the device 100. More specifically, FIG. 2C (gate length view) depicts the device 100 after a schematically depicted first sidewall spacer 116 was formed adjacent the sacrificial gate electrode 108 and after a second sidewall spacer 118 was formed adjacent the first sidewall spacer 116. The spacers 116, 118 may be formed by depositing a layer of the spacer material and thereafter performing an anisotropic etching process. In one embodiment, the spacers 116, 118 should be made of materials that may be selectively etched relative to one another. In one example, the first sidewall spacer 116 may be made of silicon dioxide, while the second sidewall spacer 118 may be made of silicon nitride. The base width of the spacers 116, 118 may vary depending upon the particular application. To the extent that the sacrificial fin protection layer 106 and the second sidewall spacer 118 are made of the same material, the thickness of the sacrificial fin protection layer 106 should be such that a portion of the sacrificial fin protection layer 106 remains to protect the fin 102 after the second sidewall spacer 118 is formed. After either the first or second sidewall spacers are formed, an implantation process is performed to form deep source/drain implant regions (not shown) in the fin 102. For an NMOS device, the deep source/drain implant regions would be formed using an N-type dopant material. Thereafter, a heating or anneal process was performed to form the final source/drain regions for the device 100. This heating process repairs any damage to the lattice structure of the fin 102 material as a result of the implantation processes and it activates the implanted dopant materials, i.e., the implanted dopant materials are incorporated into the silicon lattice.

FIG. 2D (gate length view) depicts the device 100 after several process operations were performed. First, a layer of insulating material 120 was deposited above the device 100. Thereafter, a chemical mechanical planarization process was performed to remove the gate cap layer 110 and expose the first sacrificial gate electrode 108.

FIGS. 2E (gate length view) and 2F (gate width view) depict the device 100 after one or more etching processes were performed to remove the sacrificial gate electrode 108. The process operation defines a first gate cavity 119 that exposes a portion of the sacrificial fin protection layer 106.

FIGS. 2G (gate length view) and 2H (gate width view) depict the device 100 after an oxidation process 121 was performed to oxidize the portion of the sacrificial fin protection layer 106 exposed within the gate cavity 119. The oxidized portions of the sacrificial fin protection layer 106 are indicated by the reference number 122. To the extent that the second sidewall spacer 118 and the sacrificial fin protection layer 106 are made of the same material, the upper portions of the second sidewall spacers 118 will also be oxidized, as indicated by the reference number 122X. The manner in which such oxidation processes are performed on materials such as silicon nitride are well known to those skilled in the art.

FIGS. 2I (gate length view) and 2J (gate width view) depict the device 100 after one or more timed etching processes were performed to remove the oxidized portion 122 of the sacrificial fin protection layer 106, the first sidewall spacers 116 and the oxidized portions 122X (to the extent they exist) of the second sidewall spacers 118. This etching process exposes the upper (102U) and side (102S) surfaces of the fin 102.

FIGS. 2K (gate length view) and 2L (gate width view) depict the device 100 after an oxide layer 130 is formed on the fin 102 within the gate cavity 119. The oxide layer 130 may be comprised of a variety of materials, e.g., silicon dioxide, its thickness may vary depending upon the particular application, and it may be formed by performing a thermal oxidation process. During the oxidation process, portions of the fin 102 will be consumed. Accordingly, the portion of the fin 102 in the channel region 114 of the device is not as tall as the portions of the fin 102 in the source/drain regions of the device 100, i.e., the final upper surface 102F of the fin 102 within the channel region 114 is below the level of the surface 102S of the fin 102 in the source/drain regions by a distance 132. Such a reduced height of the fin in the channel region may help to reduce undesirable short channel effects. In some embodiments, the distance 132 may be about 0.5-5 nm. Similarly, with reference to FIGS. 2L and 2M (plan view), the width 134 of the portion of the fin 102 in the channel region 114 of the device is narrower than the width 136 of the fin in the source/drain regions of the device. FIG. 2M is a plan view showing the fin 102 and the width differences of the fin 102 in the channel region 114 of the device as compared to the width 136 of the fin 102 in the source/drain regions of the device 100. The locations of the gate and the spacers are depicted in dashed lines in FIG. 2M. The difference between the widths 134 and 136 may vary, but, in one example, the width 134 may be about 40-80% of the width 136.

FIG. 2N depicts the device 100 after one or more etching processes were performed to remove the oxide layer 130 to thereby define a replacement gate cavity 160 where a replacement gate structure will subsequently be formed. In one embodiment, the oxide layer 130 is removed as part of the replacement gate technique, as depicted herein. However, the oxide layer 130 may not be removed in all applications. Even in cases where the oxide layer 130 is intentionally removed, there will typically be a very thin native oxide layer (not shown) that forms on the fin 102 within the replacement gate cavity 160.

FIG. 2O depicts the device 100 after several process operations were performed that ultimately resulted in the formation of an illustrative and schematically depicted replacement (or final) gate structure 170 in the replacement gate cavity 160, and the formation of a gate cap layer 172 above the replacement gate structure 170. The replacement gate structure 170 depicted herein is intended to be representative in nature of any type of gate structure that may be employed in manufacturing integrated circuit products.

Typically, in a replacement gate process flow, a pre-clean process will be performed in an attempt to remove all foreign materials from within the replacement gate cavity 160 prior to forming the various layers of material that will become part of the final gate structure 170. For example, the final gate structure 170 may be formed by sequentially depositing the materials of the final gate structure 170 in the replacement gate cavity 160 and above the layer of material 120, performing a CMP process to remove excess materials above the layer 120, and then performing an etch-back recess etching process such that the upper surface of the final gate structure 170 is at the desired height level within the replacement gate cavity 160 so as to make room for the formation of the gate cap layer 172. At that point, the material of the gate cap layer 172 may be deposited across the device and above the recessed final gate structure 170, and another CMP process may be performed to remove excess material from above the layer of insulating material 120 so as to thereby define the gate cap layer 172. As one specific example, the final gate structure 170 may include a high-k (k value greater than 10) gate insulation layer (not separately shown), such as hafnium oxide, that is deposited across the device 100 and within the replacement gate cavity 160. Thereafter, various conductive materials (not individually shown) may be formed in the replacement gate cavity 160 above the high-k gate insulation layer. The conductive materials may comprise at least one work function adjusting metal layer (not separately shown), e.g., a layer of titanium nitride or TiAlC, depending upon the type of transistor device being manufactured, and more than one layer of work function metal may be formed in the replacement gate cavity 160, depending upon the particular device under construction. Then, a bulk conductive material, such as tungsten or aluminum, may be deposited in the replacement gate cavity 160 above the work function adjusting metal layer(s).

As will be appreciated by those skilled in the art, there are several novel methods disclosed herein. FIG. 2P depicts the device 100 that corresponds to the point in the process flow corresponding to that shown in FIGS. 2G-2H, i.e., after the portions of the fin protection layer 106 were oxidized to form the oxidized portions 122. As depicted in FIG. 2P, at that point, a representative conductive gate structure 180 and gate cap layer 182 may be formed above the oxidized portions 122 of the sacrificial fin protection layer, i.e., the oxidized portions 122 serve as a gate insulation layer. Such a device might be formed in, for example, I/O devices, where the quality of the gate insulation layer is not as critical as it is in logic areas of an integrated circuit. The conductive gate structure 180 may be comprised of a variety of materials, e.g., polysilicon, one or more metal layers, etc.

Additionally, after a complete reading of the present application, those skilled in the art will appreciate that formation of the oxide layer 130 (see FIGS. 2K-2L) may not be required in all applications. That is, at the point in fabrication depicted in FIGS. 2I-2J, i.e., after the oxidized portion 122 of the fin protection layer 106 was removed, the replacement gate structure 170 shown in FIG. 2O may be formed in the gate cavity 119 using traditional replacement gate manufacturing techniques. While this approach would not provide the reduction in the height of the fin as is achieved when the oxide layer 130 was formed and removed, the presence of the fin protection layer 106 in the source/drain regions of the device 100 is still beneficial to reduce or eliminate the reduction of the size of the fins in those regions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a fin in a semiconductor substrate;
   forming a fin protection layer around said fin;
   forming a sacrificial gate electrode above a section of said fin protection layer;
   forming at least one sidewall spacer adjacent said sacrificial gate electrode;
   removing said sacrificial gate electrode to define a gate cavity that exposes a portion of said fin protection layer;
   oxidizing at least said exposed portion of said fin protection layer to thereby form an oxidized portion of said fin protection layer; and
   removing said oxidized portion of said fin protection layer so as to thereby expose a surface of said fin within said gate cavity.

2. The method of claim 1, wherein forming said at least one sidewall spacer comprises:
   forming a first sidewall spacer adjacent said sacrificial gate electrode; and
   forming a second sidewall spacer adjacent said first sidewall spacer.

3. The method of claim 2, wherein said first sidewall spacer is comprised of silicon dioxide and said second sidewall spacer is comprised of silicon nitride.

4. The method of claim 1, further comprising;
   forming a replacement gate structure in said gate cavity; and
   forming a gate cap layer above said replacement gate cavity.

5. The method of claim 4, wherein said replacement gate structure is comprised of at least one layer of metal and a high-k gate insulation layer.

6. The method of claim 1, further comprising
   performing an oxidation process to form an oxide layer on said exposed surface of said fin within said gate cavity;
   removing said oxide layer;
   after removing said oxide layer, forming a replacement gate structure above said fin within said gate cavity; and
   forming a gate cap layer above said replacement gate structure.

7. A method, comprising:
   forming a fin in a semiconductor substrate;
   forming a fin protection layer around said fin;
   forming a sacrificial gate electrode above a section of said fin protection layer;
   forming a first sidewall spacer adjacent said sacrificial gate electrode;
   forming a second sidewall spacer adjacent said first sidewall spacer;
   removing said sacrificial gate electrode to define a gate cavity defined by said first sidewall spacer that exposes a portion of said fin protection layer;
   oxidizing at least said exposed portion of said fin protection layer to thereby form an oxidized portion of said fin protection layer;
   removing said first sidewall spacer and said oxidized portion of said fin protection layer so as to thereby expose a surface of said fin within said gate cavity;
   performing an oxidation process to form an oxide layer on said exposed surface of said fin;
   removing said oxide layer;
   after removing said oxide layer, forming a replacement gate structure above said fin within said gate cavity; and
   forming a gate cap layer above said replacement gate structure.

8. The method of claim 7, wherein said first sidewall spacer is comprised of silicon dioxide and said second sidewall spacer is comprised of silicon nitride.

9. The method of claim 7, wherein said replacement gate structure is comprised of at least one layer of metal and a high-k gate insulation layer.

10. A method, comprising:
    forming a fin in a semiconductor substrate;
    forming a fin protection layer around said fin;
    forming a sacrificial gate electrode above a section of said fin protection layer;
    forming a first sidewall spacer adjacent said sacrificial gate electrode;
    forming a second sidewall spacer adjacent said first sidewall spacer;
    removing said sacrificial gate electrode to define a gate cavity defined by said first sidewall spacer that exposes a portion of said fin protection layer;
    oxidizing at least said exposed portion of said fin protection layer to thereby form an oxidized portion of said fin protection layer;
    removing said first sidewall spacer and said oxidized portion of said fin protection layer so as to thereby expose a surface of said fin within said gate cavity;
    forming a gate structure above said fin within said gate cavity; and
    forming a gate cap layer above said gate structure.

11. The method of claim 10, wherein said gate structure is comprised of at least one layer of metal and a high-k gate insulation layer.

12. A method, comprising:
    forming a fin in a semiconductor substrate;
    forming a fin protection layer around said fin;
    forming a sacrificial gate electrode above a section of said fin protection layer;
    forming at least one sidewall spacer adjacent said sacrificial gate electrode;
    removing said sacrificial gate electrode to define a gate cavity that exposes a portion of said fin protection layer;
    oxidizing at least said exposed portion of said fin protection layer to thereby form an oxidized portion of said fin protection layer;
    forming a conductive gate structure in said gate cavity above said oxidized portion of said fin protection layer; and
    forming a gate cap layer above said conductive gate structure.

13. The method of claim 12, wherein forming said at least one sidewall spacer comprises:
    forming a first sidewall spacer adjacent said sacrificial gate electrode; and
    forming a second sidewall spacer adjacent said first sidewall spacer.

14. The method of claim 13, wherein said first sidewall spacer is comprised of silicon dioxide and said second sidewall spacer is comprised of silicon nitride.

15. The method of claim 12, wherein said conductive gate structure is comprised of polysilicon or at least one layer of metal.

* * * * *